United States Patent [19]

Kim et al.

[11] Patent Number: 4,871,617

[45] Date of Patent: Oct. 3, 1989

[54] OHMIC CONTACTS AND INTERCONNECTS TO SILICON AND METHOD OF MAKING SAME

[75] Inventors: Manjin J. Kim; Dale M. Brown, both of Schenectady; Simon S. Cohen, Schenectady; Bernard Gorowitz, Clifton Park; Richard J. Saia, Scotia, all of N.Y.

[73] Assignee: General Electric Company, Schenectady, N.Y.

[21] Appl. No.: 595,800

[22] Filed: Apr. 2, 1984

[51] Int. Cl.[4] .......................... B32B 5/16; H01L 3/00; H01L 5/00

[52] U.S. Cl. ................. 428/450; 428/620; 428/630; 428/665; 428/663; 357/71

[58] Field of Search ............... 428/620, 630, 660, 663, 428/665, 450

[56] References Cited

U.S. PATENT DOCUMENTS

| | | | |
|---|---|---|---|
| 2,763,822 | 9/1956 | Frola et al. | 428/620 X |
| 3,106,489 | 10/1963 | Lepselter | 427/89 |
| 3,115,957 | 12/1963 | Heil | 428/630 X |
| 3,287,612 | 11/1966 | Lepselter | 428/660 X |
| 3,519,479 | 7/1970 | Inoue et al. | 428/620 X |
| 3,657,611 | 4/1972 | Yoneda | 428/620 X |
| 3,754,168 | 8/1973 | Cunningham et al. | 428/620 X |
| 3,833,842 | 9/1974 | Cunningham et al. | 428/620 X |

OTHER PUBLICATIONS

P. B. Ghate et al., Application of Ti:W Barrier Metallization for Integrated Circuits, Thin Solid Films, vol. 53 (1978), pp. 117–128.
S. E. Babcock et al., Titanium Tungsten Contacts to Silicon, J. Appl. Phys., vol. 53, No. 10, Oct. 1982, pp. 6898–6905.
J. Gniewek et al., Three Barrier Height SBD Device, IBM Technical Disclosure Bulletin, vol. 20, No. 3, Aug. 1977, pp. 1001–1002.

*Primary Examiner*—Nancy A. B. Swisher
*Attorney, Agent, or Firm*—Lawrence D. Cutter; James C. Davis, Jr.; Marvin Snyder

[57] ABSTRACT

A conductive member consisting of a first conductor of an alloy of titanium and tungsten and a second conductor of a refractory metal such as molybdenum is sintered to a conductive member of silicon of low resistivity to form a low resistance contact therewith.

10 Claims, 2 Drawing Sheets

OHMIC CONTACTS AND INTERCONNECTS TO SILICON AND METHOD OF MAKING SAME

The present invention relates, in general, to low resistance ohmic contacts and interconnects to silicon and particularly to low resistance ohmic contacts to conductive members of silicon semiconductor material of low resistivity.

A major impediment in the fabrication of low resistivity ohmic contacts to silicon is the presence of a thin layer of native oxide on the surface of the silicon. Accordingly, it is advantageous to use metals that are capable of reacting with the native oxide during the sintering or bonding step thereby removing the native oxide from the metal-silicon interface. Aluminum is a good reducing agent of silicon dioxide. Aluminum, however, in direct contact with silicon penetrates readily into the silicon during the sintering step and would short circuit any underlying shallow junction. Also, aluminum has a tendency to migrate. Titanium is also a good agent for reducing silicon dioxide. Pure titanium, however, is not suitable for contacts as direct contact between titanium and silicon has shown poor reproducibility due to the large difference in the linear thermal coefficient of expansions of titanium and silicon (the linear coefficient of expansion of titanium being three times the linear coefficient of expansion of silicon).

Alloys of tungsten and titanium have been found to be effective as a diffusion barrier for aluminum. In such cases, contact is made to a silicon substrate by reacting a thin film of platinum to produce a platinum silicide compound which provides good ohmic contact to the silicon. A relatively thick intermediate layer of alloy of titanium and tungsten is then provided between the layer of platinum silicide and a final layer of aluminum. The thick layer of the alloy of titanium and tungsten blocks the diffusion of aluminum into an underlying junction.

An object of the present invention is to provide ohmic contacts of low resistivity to conductive members of silicon semiconductor material of low resistivity.

Another object of the present invention is to provide ohmic contacts of low resistivity to conductive members of silicon semiconductor material of low resistivity which are electrically and physically stable at temperatures up to about 650° C.

Another object of the present invention is to provide conductive lines of a structure and composition which form low resistance ohmic contacts to conductive members of silicon semiconductor material of low resistivity, which provide good bonding to the insulating layer overlying the conductive members of silicon, and which provide good step coverage over the vertical walls of contact apertures in the insulating layer overlying the conductive members of silicon.

In carrying out the method of the present invention in accordance with one embodiment thereof, there is provided a first conductive member of silicon semiconductor material of one type conductivity and of low resistivity. A layer of insulating material is deposited over the first conductive member of silicon. An opening is formed in the layer of insulating material exposing a portion of the conductive member of silicon. A first layer of an alloy of titanium and tungsten is deposited over the layer of insulating material and onto the conductive member of silicon through the opening. A second layer of a refractory metal selected from the group consisting of molybdenum and tungsten is deposited on the first layer of an alloy of titanium and tungsten. A mask is provided overlying the second layer of refractory metal having a pattern of removed and unremoved portions therein. The unremoved portion of the mask represents the pattern desired in the first and second conductors. The pattern of the unremoved portion of the mask is transferred to the second layer of refractory metal and then to the first layer of the alloy of titanium and tungsten by reactive ion etching to form a second conductive member. The first and second conductive members are then heated to a temperature in the range from about 400° C. to about 650° C. for a time to cause the first conductor to be sintered to the portion of the first conductive member of silicon exposed by the opening to provide low resistance therewith, and to cause the first conductor to bond to the insulating layer.

In accordance with another aspect of the present invention, there is provided a conductive member of silicon semiconductor material of one type conductivity and of low resistivity. A layer of insulating material overlies the conductive member of silicon. An opening is provided in the layer of insulating material exposing a portion of the conductive member of silicon. A first conductor of an alloy of titanium and tungsten extends over the layer of insulating material, is sintered to the portion of the conductive member of silicon exposed by the opening in the insulating layer to provide low resistance contact therewith, and is bonded to the layer of insulating material. A second conductor of a metal selected from the group consisting of molybdenum and tungsten overlies and is in conductive contact with the first conductor.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

Figure 1:
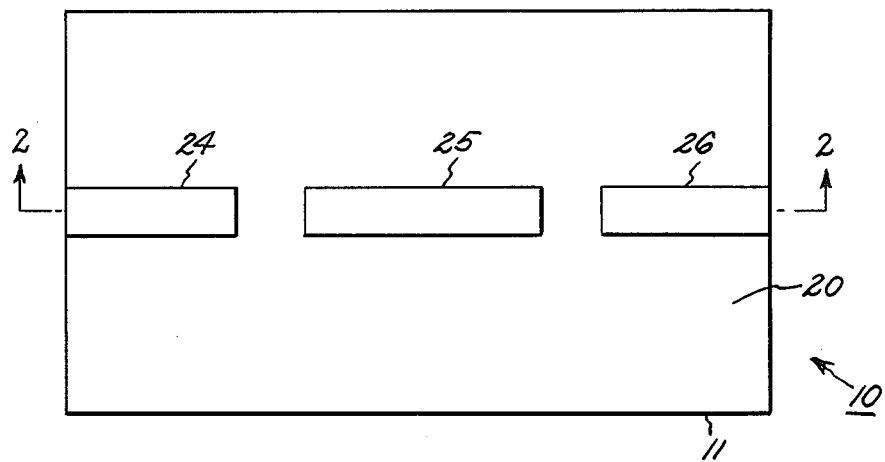
FIG. 1 is a plan view of a composite body including the substrate on which are included a plurality of conductive members of silicon of low resistivity and a plurality of conductive lines connected thereto.
Figure 2:
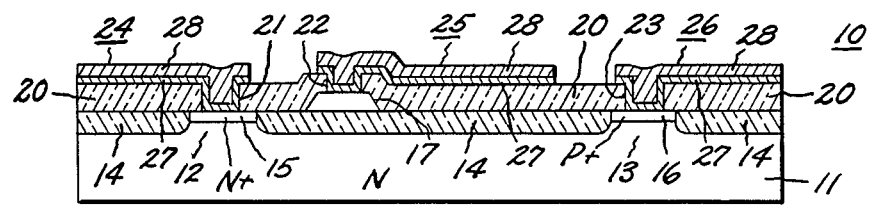
FIG. 2 is a cross sectional view of the body of FIG. 1 taken along section lines 2—2 thereof.

Referring now to FIGS. 1 and 2, there is shown a composite body 10 representing a portion of a silicon gate CMOS integrated circuit including contacts made simultaneously to an N+ region, a P+ region and a polycrystalline electrode or line. The composite body 10 includes a substrate 11 of monocrystalline silicon of relatively high resistivity having a pair of active regions 12 and 13 separated by a thick region 14 of silicon dioxide, referred to as field oxide. A region 15 of N-type conductivity and low resistivity is formed in the active region 12 and a region 16 of P-type conductivity and low resistivity is formed in the active region 13. A conductive line 17 of polycrystalline silicon which has been heavily doped with N-type activators to provide low resistivity therein is formed over the field oxide region 14. A relatively thick layer of silicon dioxide 20 is provided over the field oxide region 14 and over the elements 15, 16 and 17. Apertures or openings 21, 22 and 23 are provided in the layer 20 of silicon dioxide in registry with respective elements 15, 17 and 16 of low resistivity. A plurality of conductive members 24, 25 and 26 overlie the insulating members 20 and extend into respective openings 21, 22 and 23 thereof and make low resistance contact to respective conductive members 15, 17 and 16 of silicon of low resistivity. Each of the conductive members 24, 25 and 26 include a first conductor 27 bonded to the layer of silicon dioxide 20 and sintered to a conductive member of silicon of low resistivity and a second conductor 28 bonded to the first conductor 27. The first conductor 27 consists of an alloy of about 10% titanium and the remainder tungsten by weight. The second conductor is constituted of molybdenum. The first conductor is thin, for example, about 800 Angstroms. The second conductor is substantially thicker, for example, about 3000 Angstroms thick. The conductive members 24, 25 and 26 are formed simultaneously and make low resistance ohmic contact to respective regions 15 and 16, and conductive line 17.

The metal contact structure of FIGS. 1 and 2 is an all refractory metal contact to silicon which has a number of advantages over utilization of a metal such as aluminum as the second conductor structure. The structure is able to withstand higher processing temperatures. The structure is not subject to corrosion due to galvanic action. The surface of a deposited layer of molybdenum is smooth and free of hillocks enabling smooth layers of other materials such as silicon dioxide to be deposited thereover. Molybdenum does not penetrate or spike through materials such as alloys of titanium and tungsten in contact with it. Molybdenum is a much harder metal than aluminum and does not migrate.

Figure 3A:
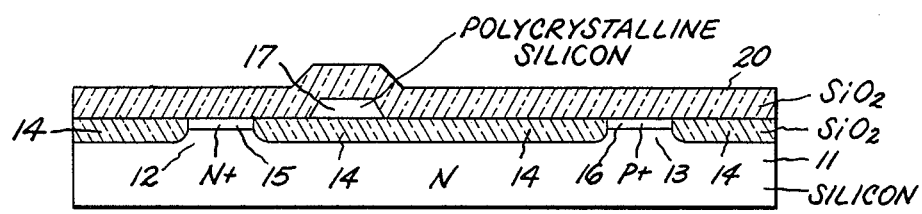
FIGS. 3A-3C show cross sections of structures representing successive steps in a method of fabricating the composite structure of FIG. 1 in accordance with the present invention.

A method of fabricating the composite structure of FIGS. 1 and 2 will now be described in connection with FIGS. 3A-3C. The elements of FIGS. 3A-3C which are identical to the elements of FIGS. 1 and 2 are identically designated A substrate of N-type monocrystalline silicon semiconductor material about 15 mils thick having a resistivity of about 1.0 ohm cm, for example, and having a major surface parallel to the (100) plane of the crystal is provided Active regions 12 and 13 are suitably masked and regions where field oxide 14 is to be formed are etched away to form recesses. Thereafter, the substrate is thermally oxidized to form the field oxide region 14 therein about 5000 Angstroms thick. The masking layers protecting the active regions 12 and 13 from oxidation are then removed. The active regions 12 and 13 are provided with activators or dopants of appropriate conductivity type by such means as diffusion or ion implantation to form the N+ region 15 of low resistivity in active region 12 and the P+ region 16 of low resistivity in active region 13. A suitable N-type dopant is arsenic. A suitable P-type dopant is boron. Region 15 extends about 3000 Angstroms below the surface thereof Region 16 extends about 4000 Angstroms below the surface thereof. Next, a layer of polycrystalline silicon about 4000 Angstroms thick suitably doped with phosphorous to provide low resistivity is formed on the layer of field oxide 14 and is thereafter patterned by suitable photolithographic masking and etching techniques to form the conductive line 17. An interlevel layer of silicon dioxide about 4000 Angstroms thick is thereafter deposited on the regions 15 and 16, the field oxide 14, and the polycrystalline silicon line 17 by chemical vapor deposition using dichlorosilane and nitrous oxide at about 925° C. The resultant structure is shown in FIG. 3A which is made by entirely conventional techniques well known to those skilled in the art.

Figure 3B:
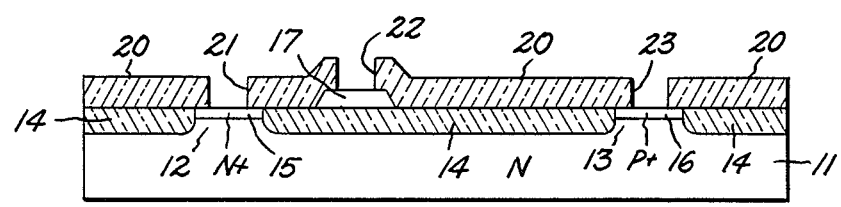
Figure 3C:
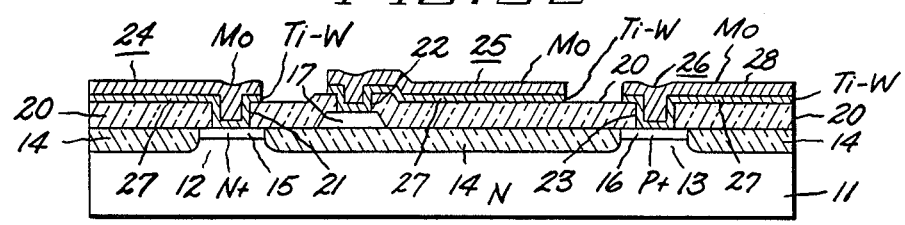

Thereafter, a plurality of openings or apertures 1.3 microns in diameter are formed in the layer 20 of silicon dioxide by photolithographic masking and etching techniques well known to those skilled in the art, as shown in FIG. 3B. Apertures 21, 22 and 23 are in registry with respective regions 15, 17 and 16 exposing surface portions thereof. After suitable cleaning of the surface portions of conductive members 15, 17 and 16 of silicon by entirely conventional means such as rinsing in a solution of hot hydrogen peroxide and sulfuric acid followed by a water rinse and a dip in hydrofluoric acid buffered by ammonium fluoride to remove native silicon oxide thereon, the structure of FIG. 3B is placed in sputtering apparatus in which a layer of about 800 Angstroms thick of an alloy consisting of about 10 percent titanium and the remainder tungsten by weight is sputtered over the layer 20 of silicon dioxide and into the apertures 21, 22 and 23 therein to cover the walls of the apertures and also the exposed portions of the conductive members 15, 17 and 16 of silicon semiconductor material. Using the same sputtering apparatus without breaking the vacuum therein molybdenum is sputter deposited over the layer of the alloy of titanium and tungsten to a thickness of about 3000 Angstroms. Thereafter, the composite layer consisting of the first layer of titanium and tungsten and the second layer of molybdenum is provided with a suitable mask, such as photoresist AZ1470J available from the Shipley Co. of Newton, Mass., in which a pattern of removed and unremoved portions has been formed. The unremoved portions correspond to the pattern of the 35 conductive members 24, 25 and 26 to be formed therefrom. Thereafter, the pattern of the unremoved portions of the mask is transferred to the second layer of molybdenum and then transferred to the first layer of the alloy of titanium and tungsten by reactive ion etching to form, respectively, the second conductor 28 and the first conductor 27 of the conductive members 24, 25 and 26. The reactive etching is carried out in an Anelva type 503 reactive ion etching system using a gas mixture of 25% dichlorodifluoro methane and 75% oxygen by weight at a power density of about 0.25 watts/cm$^2$, a pressure of 0.1 Torr, and a total flow of 60 sccm (standard cubic centimeters per minute). After removal of the photoresist the resultant structure is cleaned by means well known in the art. The resultant structure is then heated to a temperature of about 400° C. for 60 minutes in hydrogen at atmospheric pressure to cause the first conductor 27 of an alloy of titanium and tungsten of each of the conductive members 24, 25 and 26 to be sintered to the portion of the conductive members 15, 17 and 16 of silicon exposed through the openings 21, 22 and 23 of the layer 20 of silicon dioxide and also to bond to the insulating layer 20.

The first conductor 27 of an alloy of 10% titanium and the remainder tungsten by weight forms a stable low resistance ohmic contact to the silicon conductive members 15, 17 and 16, and also forms a strong bond to the thick layer 20 of silicon dioxide. It is believed that during the sintering step titanium in the conductor 27 at the interface between the conductor 27 and the silicon conductive members 15, 17 and 16 reacts with native silicon dioxide present on the exposed portions of these conductors to form silicon and titanium dioxide, a semiconductor, thereby reducing the interface resistance. Alloys in the range of about 10% to 40% by weight of titanium and the remainder tungsten are particularly suitable for providing low resistance contacts to silicon.

While in the example described above a temperature of 400° C. was utilized for the sintering step, higher temperatures up to about 650° C. could have been utilized. It has been found that, in general, utilizing higher temperatures and substantially the same time of 1 hour lower resistance contacts were formed both to N+ silicon conductive members and to P+ silicon conductive members with a greater percentage reduction in resistance occurring in the latter case. The lowest reduction occurred in the temperature range of 600° to 650° C. In the case of P+ silicon conductive members the specific contact resistance was reduced by about 50% over the specific contact resistance obtained at 400° C.

In contacts made at about 400° C. to N+ regions of silicon having a concentration of arsenic atoms of about $3 \times 10^{20}$ atoms per cm$^3$, specific contact resistance ranged from 10 to 20 ohm - (micrometer)$^2$. In contacts made at about 400° C. to P+ regions of silicon having a concentration of boron atoms of about $7 \times 10^{19}$ atoms per cm$^3$, specific contact resistance ranged from 15 to 40 ohm - (micrometers)$^2$.

In contacts made at about 650° C. to N+ regions of silicon having a concentration of arsenic atoms of about $3 \times 10^{20}$ atoms per cm$^3$, specific contact resistance ranged from 8 to 15 ohm - (micrometer)$^2$. In contacts made at about 650° C. to P+ regions of silicon having a concentration of boron atoms of about $7 \times 10^{19}$ atoms per cm$^3$, specific contact resistance ranged from 10 to 20 ohm - (micrometer)$^2$.

While in the example described above, the layer of the alloy of titanium and tungsten utilized was 800 Angstroms thick, a thinner layer dependent on the density of faults therein and the smoothness of the surface thereof could have been utilized. A thickness of about 400 Angstroms would be adequate. The layer of the alloy of titanium and tungsten could be made as thick as desired with due regard to the fact that the greater the thickness of this layer in relation to the thickness of the layer of molybdenum, the greater would be the overall resistance of the two conductors.

While the second conductor 28 of the conductive members 24, 25 and 26 is constituted of molybdenum, tungsten could as well have been utilized.

While the invention has been described in specific embodiments, it will be understood that modifications, such as those described above, may be made by those skilled in the art and it is intended by the appended claims to cover all such modifications and changes as fall within the true spirit and scope of the invention.

What is claimed is:

1. In combination,
   a conductive member of silicon semiconductor material of one type conductivity and of low resistivity;
   a layer of insulating material overlying said conductive member of silicon, said insulating material having an opening in said layer exposing a portion of said conductive member of silicon;
   a first conductor of an alloy of titanium and tungsten sintered to the portion of said conductive member of silicon exposed by said opening to form a low resistance contact therewith and bonded to said layer of insulating material; and
   a second conductor of a metal selected from the group consisting of molybdenum and tungsten overlying and bonded to said first conductor.

2. The combination of claim 1 in which said conductive member is a region in a monocrystalline substrate of silicon.

3. The combination of claim 1 in which said conductive member is polycrystalline silicon.

4. The combination of claim 1 in which said insulating material is silicon dioxide.

5. The combination of claim 1 in which said one type conductivity is N-type conductivity.

6. The combination of claim 1 in which said one type conductivity is P-type conductivity.

7. The combination of claim 1 in which said alloy of titanium and tungsten consists of titanium in the range from about 10% to about 40% and the remainder tungsten by weight.

8. The combination of claim 1 in which said second layer of refractory metal is molybdenum.

9. The combination of claim 1 in which said second layer of refractory metal is tungsten.

10. The combination of claim 1 in which said first conductor has a thickness greater than about 400 Angstroms and said second conductor has a thickness substantially greater than said thickness of said first conductor.

* * * * *